United States Patent [19]
Johnson

[11] Patent Number: 5,861,720
[45] Date of Patent: Jan. 19, 1999

[54] SMOOTH SWITCHING POWER CONTROL CIRCUIT AND METHOD

[75] Inventor: Samuel A. Johnson, Eagle, Id.

[73] Assignee: Beacon Light Products, Inc., Meridian, Id.

[21] Appl. No.: 753,418

[22] Filed: Nov. 25, 1996

[51] Int. Cl.$^6$ .................................................... G05F 1/00
[52] U.S. Cl. .......................... 315/291; 315/307; 315/360; 315/362; 315/DIG. 4; 315/DIG. 7
[58] Field of Search ..................................... 315/291, 297, 315/307, 360, 362, 208, 209 R, 209 SC, 200 R, DIG. 4, DIG. 5, DIG. 7; 307/139–141.4; 323/235, 239

[56] References Cited

U.S. PATENT DOCUMENTS

| | | | |
|---|---|---|---|
| Re. 31,848 | 3/1985 | Nilssen | 315/360 |
| Re. 35,220 | 4/1996 | Johson | 315/208 |
| 3,265,930 | 8/1966 | Powell, Jr. | 315/209 |
| 3,422,309 | 1/1969 | Spira et al. | 315/194 |
| 3,641,403 | 2/1972 | Nakata | 317/235 |
| 3,684,919 | 8/1972 | Cramer | 315/194 |
| 3,697,821 | 10/1972 | Johnson | 317/148 |
| 3,707,648 | 12/1972 | Rosa | 315/231 |
| 3,808,456 | 4/1974 | Kay et al. | 307/140 |
| 3,818,263 | 6/1974 | Belko | 315/32 |
| 3,823,339 | 7/1974 | Borneman et al. | 315/69 |
| 3,851,209 | 11/1974 | Murakami et al. | 315/99 |
| 3,919,590 | 11/1975 | Remery et al. | 315/101 |
| 3,925,705 | 12/1975 | Elms et al. | 315/246 |
| 3,927,345 | 12/1975 | Licata et al. | 315/DIG. 5 |
| 3,935,505 | 1/1976 | Spiteri | 315/194 |
| 3,939,361 | 2/1976 | Aidala et al. | 307/141 |
| 3,942,070 | 3/1976 | Tomura et al. | 315/101 |
| 3,952,242 | 4/1976 | Ukai | 323/21 |
| 4,011,482 | 3/1977 | Seib | 315/361 |
| 4,087,723 | 5/1978 | Chermin et al. | 315/207 |
| 4,090,107 | 5/1978 | Seib | 315/156 |

(List continued on next page.)

FOREIGN PATENT DOCUMENTS

| | | |
|---|---|---|
| 0674390 | 9/1995 | European Pat. Off. . |
| 2508348 | 11/1975 | Germany . |
| 211028 | 6/1984 | Germany . |
| 5335558 | 12/1993 | Japan . |
| 1275749 | 5/1972 | United Kingdom . |

OTHER PUBLICATIONS

Starlight TN22 Preliminary Data Sheet, *SGS–Thompson Microelectronics*; Nov. 1991; pp. 1/5–5/5.

Manual; National Standard of Canada, "Limits and Methods of Measurement of Electromagnetic Disturbance Characteristics of Industrial, Scientific and Medical (ISM) Radio–Frequency Equipment" Dec. 1991; pp. 4–5.

Manual; International Electrotechnical Commision, Fourth Edition; "Limits and Method of Measurement of Radio Disturbance Characteristics of Electrical Lighting and Similar Equipment"; 1992; pp. 7–9, 15, 17, 19.

Manual; International Electrotechnical Commission, Third Edition; "Limita and Methods of Measurement of Radio Disturbance Characteristics of Electrical Motor–Operated and Thermal Appliances for Household and Similar Purposes, Electrical Tools and Electrical Apparatus"; 1993; pp. 19 and 98.

*Primary Examiner*—Robert J. Pascal
*Assistant Examiner*—Haissa Philogene
*Attorney, Agent, or Firm*—John R. Ley

[57] ABSTRACT

A power control circuit achieves a relatively smooth turn-on conduction transition characteristic and a relatively low power consumption. A controlled transition circuit conducts current to a load when in a fully conductive state. The transition circuit transitions from a non-conductive state to the fully conductive state over a predetermined amount of time to limit the di/dt and the interference signals generated by the di/dt. A low forward voltage conduction circuit also conducts current to the load in a conductive state and diverts current to the transition circuit when in a non-conductive state. The conduction circuit creates a second predetermined voltage across the terminals when in the conductive state which is substantially less than the first predetermined voltage to reduce the power consumption.

30 Claims, 4 Drawing Sheets

U.S. PATENT DOCUMENTS

| | | | |
|---|---|---|---|
| 4,099,099 | 7/1978 | Grüdelbach | 315/194 |
| 4,107,579 | 8/1978 | Bodine, Jr. et al. | 315/205 |
| 4,118,654 | 10/1978 | Ohta et al. | 40/361 |
| 4,119,887 | 10/1978 | Iyama et al. | 315/101 |
| 4,155,015 | 5/1979 | Nakasone et al. | 307/252 |
| 4,165,475 | 8/1979 | Pegg et al. | 315/99 |
| 4,181,872 | 1/1980 | Chermin | 315/106 |
| 4,204,149 | 5/1980 | Cleary et al. | 323/24 |
| 4,259,619 | 3/1981 | Wall | 315/361 |
| 4,276,486 | 6/1981 | Ahuja et al. | 307/252 |
| 4,276,542 | 6/1981 | Russ | 340/326 |
| 4,321,508 | 3/1982 | Adler et al. | 315/291 |
| 4,322,632 | 3/1982 | Hart et al. | 307/41 |
| 4,329,627 | 5/1982 | Holmes | 315/209 |
| 4,350,935 | 9/1982 | Spira et al. | 315/291 |
| 4,355,264 | 10/1982 | Merli | 315/289 |
| 4,447,759 | 5/1984 | Moerkens et al. | 315/60 |
| 4,504,778 | 3/1985 | Evans | 323/323 |
| 4,507,569 | 3/1985 | Hess, II | 307/130 |
| 4,527,099 | 7/1985 | Capewell et al. | 315/291 |
| 4,591,765 | 5/1986 | Beck | 315/361 |
| 4,613,790 | 9/1986 | Roorda | 315/72 |
| 4,628,230 | 12/1986 | Krokaugger | 315/307 |
| 4,634,957 | 1/1987 | Hollaway | 323/242 |
| 4,644,226 | 2/1987 | Vernooij et al. | 315/50 |
| 4,649,323 | 3/1987 | Peralman et al. | 315/307 |
| 4,651,060 | 3/1987 | Clark | 315/199 |
| 4,668,877 | 5/1987 | Kunen | 307/116 |
| 4,673,844 | 6/1987 | Maytum et al. | 315/200 |
| 4,695,739 | 9/1987 | Pierce | 307/141 |
| 4,733,138 | 3/1988 | Pearlman et al. | 315/307 |
| 4,745,311 | 5/1988 | Iwasaki | 307/632 |
| 4,804,916 | 2/1989 | Frank | 323/300 |
| 4,870,340 | 9/1989 | Kral | 323/235 |
| 4,899,088 | 2/1990 | Black, Jr. et al. | 315/291 |
| 4,928,055 | 5/1990 | Kaieda et al. | 323/300 |
| 4,988,921 | 1/1991 | Ratner et al. | 315/159 |
| 5,004,960 | 4/1991 | Cockram et al. | 315/307 |
| 5,010,274 | 4/1991 | Phillips et al. | 315/101 |
| 5,030,890 | 7/1991 | Johnson | 315/208 |
| 5,055,746 | 10/1991 | Hu et al. | 315/291 |
| 5,111,115 | 5/1992 | Ball et al. | 315/239 |
| 5,126,634 | 6/1992 | Johnson | 315/71 |
| 5,214,354 | 5/1993 | Johnson | 315/71 |
| 5,221,877 | 6/1993 | Falk | 315/291 |
| 5,264,761 | 11/1993 | Johnson | 315/291 |
| 5,268,631 | 12/1993 | Gorman et al. | 323/246 |
| 5,319,285 | 6/1994 | Wang et al. | 315/289 |
| 5,321,619 | 6/1994 | Nuckolls et al. | 315/290 |
| 5,436,534 | 7/1995 | Matsuda et al. | 315/291 |
| 5,504,394 | 4/1996 | Johnson | 315/71 |
| 5,504,395 | 4/1996 | Johnson et al. | 315/71 |

SMOOTH SWITCHING POWER CONTROL CIRCUIT AND METHOD

This invention relates to power control circuits such as dimming circuits typically used with electric lights. More particularly, the present invention relates to a new and improved power control or dimming circuit which exhibits a smooth switching transition to significantly reduce radiated and conductive interference signals and which consumes a minimal amount of power to reduce heating.

CROSS REFERENCE TO RELATED APPLICATIONS

This invention is related to the invention described in a concurrently filed U.S. patent application for a "Smooth Switching Module", Ser. No. 08/753,420 and is hereby incorporated in this application by this reference.

BACKGROUND OF THE INVENTION

Many types of electrical and electronic devices generate radiated and conductive interference signals. Radiated interference signals are typically broadcast through space. Conductive interference signals are typically conducted over power supply mains or power conductors. Radiated interference signals, if substantial enough in magnitude, may pose a health hazard. More typically however, conductive interference signals may adversely interfere with the proper operation of other electronic circuits which are located in close proximity and connected to the power supply mains. For these, and other reasons, electronic devices are subject to governmental and regulatory restrictions limiting the amount of interference which can be emitted from such products. Exemplary regulations include the Canadian "Limits and Methods of Measurement of Electromagnetic Disturbance Characteristics of Industrial, Scientific and Medical Radio Frequency Equipment," CAN/CSA-C108.6-M91(CISPR 11:1990), which were prepared by the Canadian Standards Association and approved by the Standards Council of Canada. The acronym "CISPR" refers to the Comité International Special des Perturbations Radioelectriques, also known as the International Special Committee on Radio Interference. The CISPR is the international committee that promotes unification by recommending approved standards to National Committees for adoption. Typically, the National Committees adopt the CISPR recommendations as their national rules in so far as national conditions will permit. Thus, exemplary regulations that set limits for interference characteristics of electrical lighting and similar equipment may be found in the CISPR reports.

One source of conductive interference in power control situations—including the situation where electrical lighting constitutes the load—is a dimmer which switches the applied current on and off during each half cycle of AC power to regulate the power delivered to the load and therefore the output of the load, e.g., the intensity of the light. Typical dimmers use silicon controlled rectifiers (SCRs) or triacs, both of which are hereinafter generically referred to as thyristors. The thyristor is usually mounted in a wall switch box or otherwise integrated with the lighting device itself. An example of a thyristor-based dimmer is described in U.S. Pat. No. Re. 35,220 which is assigned to the assignee hereof.

A thyristor generates interference signals as a result of an essentially instantaneous and virtually discontinuous current transition when switching from an off or non-conductive condition to an on or conductive condition, when a significant voltage exists across the thyristor at the time that the switching occurs. The instantaneous and discontinuous current transition is an inherent result of the switching action of the thyristor. The magnitude of the interference signal depends directly upon the magnitude of the current change with respect to time (di/dt). A relatively low di/dt value associated with the transition creates relatively low levels of interference. By comparison, larger di/dt values produce larger levels of interference signals.

Attempts to control the interference signals generated by thyristor-based dimmers have involved the addition of auxiliary attenuating circuit elements. The attenuating circuit elements have taken the form of filters which may be as simple as a capacitor or inductor, or as complex as an elaborate multi-pole, multi-component, complex filter using both passive and active elements. U.S. Pat. Nos. 5,264,761; 5,504,394 and 5,504,395, all assigned to the assignee hereof, describe examples of such filtering and attenuation devices used with a thyristor. These auxiliary attenuating elements add to the complexity and the manufacturing expense associated with the products in which the thyristors are employed.

The other known method of reducing interference involves the use of a transistor-based switching circuit which provides a slower and smoother switching transition. The transistor-based switching circuit can be slowly turned on since the conduction characteristics of a power control transistor are related to the bias signal of the transistor. Slowly increasing this bias signal using simple circuit elements causes the transistor to slowly switch into full conduction. Moreover, during the transition period, current is conducted through the transistor an amount that is proportional to the bias signal. Thus, the current change rate with respect to time (di/dt) through the transistor can be lowered based upon the simple circuit elements used to produce a gradual change in the bias signal. Since the magnitude of the interference signals is directly related to the magnitude of the di/dt, decreasing the di/dt reduces the magnitude of any generated interference signals. Typically, because of the lower di/dt, the transistor-based switching circuit avoids generating significant interference signals and is thus capable of complying with the pertinent regulations.

Even though the transistor-based circuits provide the desirable slow turn-on characteristics and thus achieve interference signal attenuation, they consume significant amounts of power. The forward conduction voltage of the power transistor and the forward bias voltages of rectification diodes required for use with the transistors result in power consumption. Because the power transistors are direct current devices, a diode bridge is required to rectify the AC current for use by the power transistor. For example, the voltage across the fully-conductive power transistors and diode bridge may be approximately 4–6 volts. The resulting power consumption may be high in high-current situations, for example, in the neighborhood of 60 or more watts in some lighting situations.

The power consumption translates into more heat generated by the switching circuit. Since high levels of heat will destroy the semiconductor elements, heat sinks are usually required to dissipate the heat. Heat sinks are relatively large and the addition of heat sinks to the circuit increases its overall size. The resulting size may be too large to integrate such a switching circuit into small spaces such as lamp sockets and lamp bases. Furthermore, the useful longevity of the semiconductor elements is decreased in a high-heat environment.

The thyristor-based dimmers, on the other hand, do not consume large amounts of power nor do they generate significant amounts of heat. Since the thyristor, once triggered into conduction, is the primary circuit element conducting current and thus consuming power, the power consumed by the circuit is dependent on the forward voltage characteristics of the thyristor. Typically, the voltage drop across the thyristor is approximately 1.2–1.6 volts. Thus, the power consumption is substantially reduced compared to the power consumption of a transistor-based switching circuit. Unfortunately, the di/dt values associated with known thyristor-based dimmers are large, as noted above, thus generating unacceptable levels of interference signals.

It is with respect to these and other factors that the present invention has evolved.

SUMMARY OF THE INVENTION

One aspect of the present invention relates to a power control or dimmer circuit that uses a thyristor as its primary current conduction element and which exhibits a slow, relatively smooth switching transition from a non-conductive state to a conductive state. Another aspect of the present invention relates to a dimmer circuit that exhibits a slow, relatively smooth switching characteristic to avoid the generation of interference signals while exhibiting low power consumption. Moreover, another aspect of the invention relates to a dimmer circuit that provides slow, smooth switching transitions, consumes relatively low amounts of power and remains substantially small in size.

In accordance with these and other aspects, a power control circuit of the present invention achieves a relatively smooth turn-on conduction transition characteristic and a relatively low forward voltage drop and power consumption. The power control circuit includes a pair of terminals adapted to be connected in series with a load and a power source which supplies power to the load. A controlled transition circuit is electrically connected to conduct current between the terminals when in a fully conductive state and not to conduct current between the terminals when in a non-conductive state. The transition circuit transitions from the non-conductive state to the fully conductive state over a first predetermined amount of time and creates a first predetermined voltage across the terminals when in the fully conductive state. A low forward voltage conduction circuit is also electrically connected to conduct current between the terminals when in a conductive state and to divert current to the transition circuit when in a non-conductive state. The conduction circuit transitions from the non-conductive state to the conductive state over a second predetermined amount of time which is substantially less than the first predetermined amount of time. The conduction circuit also creates a second predetermined voltage across the terminals when in the conductive state, and the second predetermined voltage is substantially less than the first predetermined voltage.

In accordance with its preferred aspects, the power control circuit further includes a delay circuit which operatively initiates a transition of the conduction circuit from its non-conductive state to its conductive state after the expiration of the first predetermined amount of time. The delay circuit also operatively limits the conduction circuit from conducting current between the terminals until after the transition circuit is in the fully conductive state. A power transistor is part of the transition circuit and a thyristor is part of the conduction circuit. A trigger signal delivery circuit triggers the thyristor into conduction at the expiration of the first predetermined amount of time. A reset circuit is connected to the transistor to terminate conduction of the transistor after expiration of the second predetermined amount of time.

In accordance with another one of its major aspects, the controlled transition circuit of the power control circuit further comprises a switching transistor, a bias signal generating circuit connected to generate a bias signal which increases in magnitude over a first predetermined amount of time and which generally establishes the magnitude of conductivity of the switching transistor. The switching transistor responds to the bias signal to transition from a non-conductive state to a fully conductive state over the duration of the first predetermined amount of time. The low forward voltage conduction circuit operatively conducts current through the load after the switching transistor achieves the fully conductive state. A thyristor is triggered into a conductive state in response to the application of a trigger signal. A trigger signal developing device responds to the current conducted to the load by the switching transistor to develop the trigger signal from the current conducted by the switching transistor. A delay circuit delays the application of the trigger signal to the thyristor for a predetermined amount of time sufficient to allow the transistor to achieve the fully conductive state.

In accordance with another of its major aspects, the present invention relates to a method of controlling the amount of power supplied to a load connected to an AC power source while reducing generation of interference signals and while consuming small amounts of power. The method involves the steps of attaching a switching transistor substantially in series with the load and the AC power source, biasing the switching transistor from a non-conductive state to a first conductive state over a predetermined amount of time, the predetermined amount of time being substantially long enough to reduce its change in current per change in time to a sufficiently low value to substantially limit the interference signal generation occurring as a result of the transition from the non-conductive state to the first conductive state, establishing a predetermined voltage across the switching transistor in the first conductive state, attaching a thyristor in series with the load and the AC power source and substantially in parallel with the switching transistor, triggering the thyristor from a non-conductive state into a second conductive state after expiration of the predetermined amount of time, and establishing a predetermined voltage across the thyristor in the second conductive state which is less than the voltage across the switching transistor in the first conductive state.

A more complete appreciation of the present invention and its scope may be obtained from the accompanying drawings, which are briefly summarized below, from the following detailed description of a presently preferred embodiment of the invention, and from the appended claims which define the scope of this invention.

BRIEF DESCRIPTION OF THE DRAWINGS

FIG. 5 is an exemplary waveform diagram depicting the voltage across a prior-art, thyristor-based switching circuit when the thyristor switches into conduction. FIG. 5 is shown in relation with FIG. 4 for comparison purposes.

DETAILED DESCRIPTION

Figure 1:
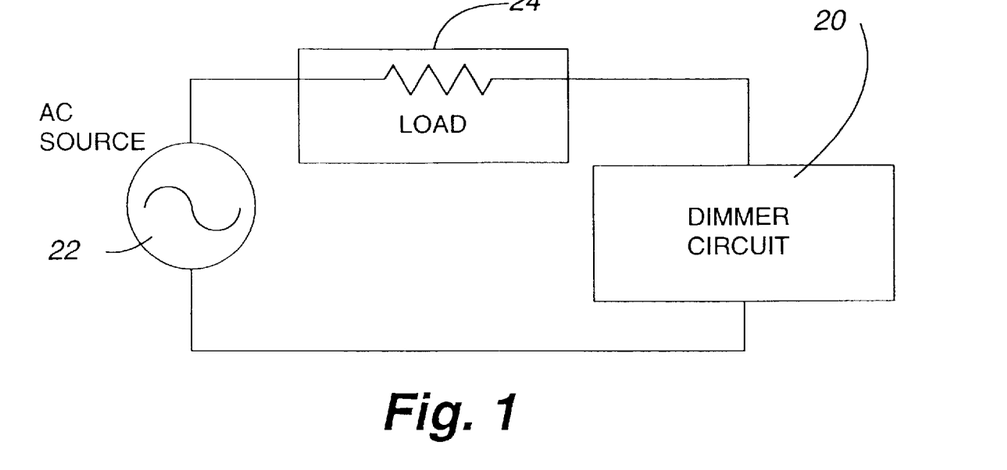
FIG. 1 is a block diagram of a dimmer circuit incorporating the present invention connected in series with a load and an AC power source.

A dimmer circuit 20 which incorporates the present invention is shown in FIG. 1. The dimmer circuit 20 is one example of a power control circuit which controls the power delivered from a conventional AC power source 22 to a conventional load 24. Since the dimmer circuit 20 is connected in series with the load 24, the source 22 supplies AC power to the load 24 on a half-cycle basis only when the dimmer circuit 20 is conducting current. Typical loads 24 that may be used with the dimmer circuit 20 include lamps, electric motors or any other device where controlling the applied AC power is desirous. For example, when the load 24 is a lamp, it is desirous to limit, on a half-cycle by half-cycle basis, the amount of applied AC power to allow for variable control over the lamp's illumination.

Generally, the dimmer circuit 20 of the present invention regulates the amount of power supplied to the load 24 by acting as a switch. When the dimmer circuit 20 is "open", i.e., not conducting current, the load 24 essentially receives no source current. When the dimmer circuit 20 is "closed", i.e., conducting current, the load 24 receives source current. The voltage relationship between the dimmer circuit 20 and the load 24 is illustrated in FIGS. 2 and 3.

Figure 2:
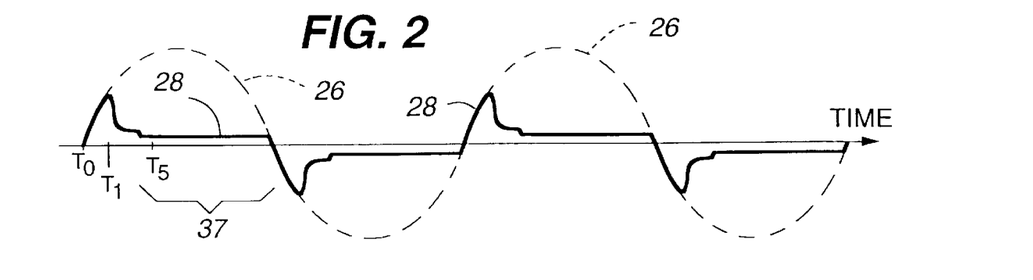
FIG. 2 is a waveform diagram depicting the voltage across the dimmer circuit shown in FIG. 1 in relation to the AC voltage supplied from the source shown in FIG. 1, over four consecutive half cycles while the dimmer circuit is conductive.
Figure 3:
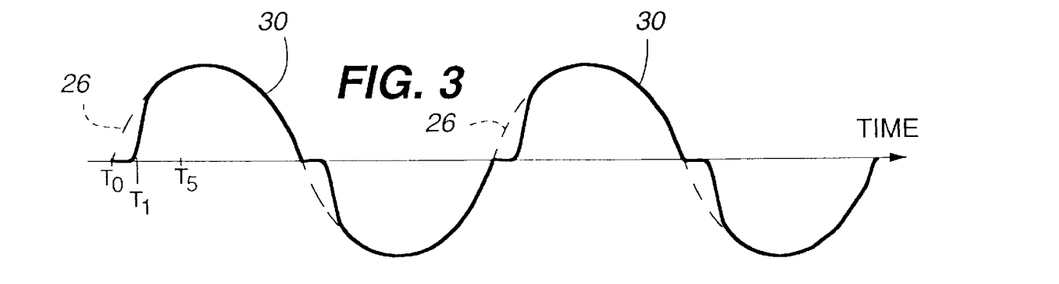
FIG. 3 is a waveform diagram depicting the voltage across the load shown in FIG. 1. in relation to the AC voltage supplied from the source shown in FIG. 1, over four consecutive half cycles during operation of the dimmer circuit shown in FIG. 1.
Figure 4:
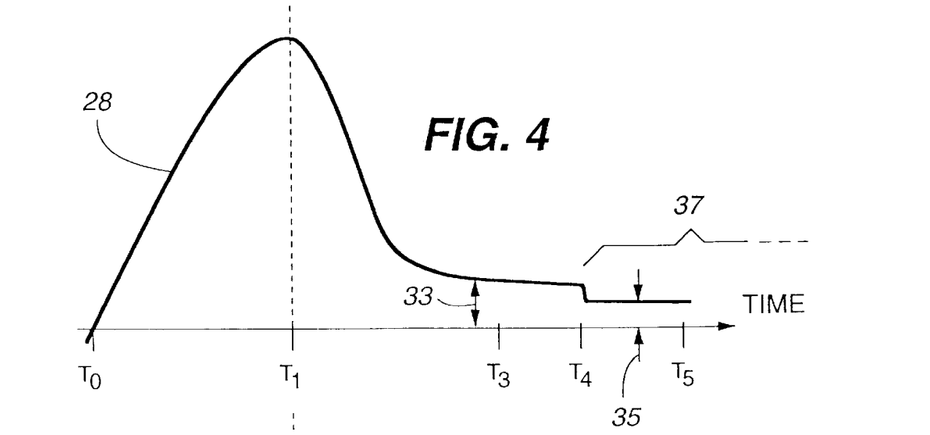
FIG. 4 is an enlarged illustration of a portion of the waveform shown in FIG. 2 showing an example of the voltage across the dimmer circuit shown in FIG. 1 when the dimmer circuit switches into a conductive state.

From the beginning of each half cycle at time $T_0$, until the dimmer circuit 20 begins to conduct current at time $T_1$, the dimmer circuit 20 is in a non-conducting state, as shown in FIGS. 2 and 4. At time $T_1$ the dimmer circuit 20 switches into the current conducting state which is demonstrated by the dimmer circuit voltage waveform 28. Switching into a current conducting state causes the source-supplied voltage waveform 26 to begin to be applied to the load 24 as illustrated by the load voltage waveform 30 shown in FIG. 3. By time $T_5$, the dimmer circuit 20 is fully conductive and thus the majority of power supplied by the source 22 (FIG. 1) is applied to the load 24 (FIG. 1), as is shown in FIG. 3 by the load voltage waveform 30. This operation is repeated every half cycle to effectively control the total amount of power applied to the load 24. Variable control over the time when the dimmer circuit 20 switches into conduction ($T_1$), allows variable amounts of delivered power to the load 24 during each applied half-cycle.

Figure 5:
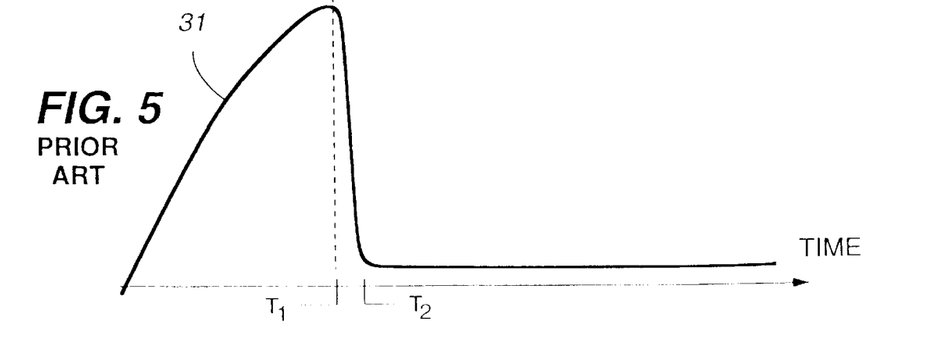

As shown in FIG. 4, a gradual, smooth slope or transition of the dimmer circuit voltage 28 exists from time $T_1$ to time $T_3$. This transition is an example of the smooth switching characteristic of the dimming circuit 20. The transition time period from time $T_1$ to time $T_3$ may range, for example, from approximately 40 μs to 100 μs to avoid generation of interference signals. FIG. 5 depicts an exemplary voltage waveform 31 across a common, prior art thyristor-based switching circuit. As can be seen from comparing the waveform 28 shown in FIG. 4 to the waveform 31 shown in FIG. 5, the switching characteristic of the prior-art, thyristor-based switching circuit appears almost instantaneous. The typical switching transition time from time $T_1$ to time $T_2$ shown in FIG. 5 lasts only a few μs compared to the much longer switching transition of waveform 28 between times $T_1$ and $T_3$ as shown in FIG. 3. Therefore, the dimming circuit 20 has a much longer and more smooth switching transition period. Lengthening the switching transition period in this manner significantly reduces the conducted and radiated interference signals.

The switching transition time period from $T_1$ to $T_3$ shown in FIG. 4 is the "dt" used to determine the "di/dt" which directly relates to the magnitude of the interference signals. Therefore, by increasing dt, the value of di/dt decreases which likewise decreases the magnitude of any interference signals. By comparison, the switching transition time period $T_1$ to $T_2$ shown in FIG. 5 is much smaller than the switching transition time period shown in FIG. 4. The much smaller dt shown in FIG. 5 translates into higher di/dt values and likewise significantly higher amounts and magnitudes of generated interference signals.

At time $T_3$ shown in FIG. 4, the dimmer circuit 20 is conducting current and a majority of source-applied power is applied to the load (FIG. 3). However a notable dimmer circuit voltage 28 across the dimmer circuit 20 exists at time $T_3$; for example, the dimmer circuit voltage waveform 28 may be approximately 4–6 volts, as is shown at 33 in FIG. 4. As a result, the dimmer circuit 20 is consuming significant amounts of power, particularly at high current conduction conditions. At time $T_4$ the dimmer circuit 20 decreases the voltage waveform 28 across it from the value of approximately 4–6 volts to a lower value of approximately 1.2–1.6 volts as is shown at 35 in FIG. 4. Lowering the voltage across the dimmer circuit 20 for the remainder of the applied half-cycle (shown at 37 in FIGS. 2 and 4) significantly reduces overall power consumption and heat production of the dimmer circuit 20. Thus, as can be seen from voltage waveform 28 shown in FIGS. 2 and 4, the dimmer circuit 20 achieves a smooth switching transition to reduce interference signals while still obtaining relatively low power consumption.

Figure 6:
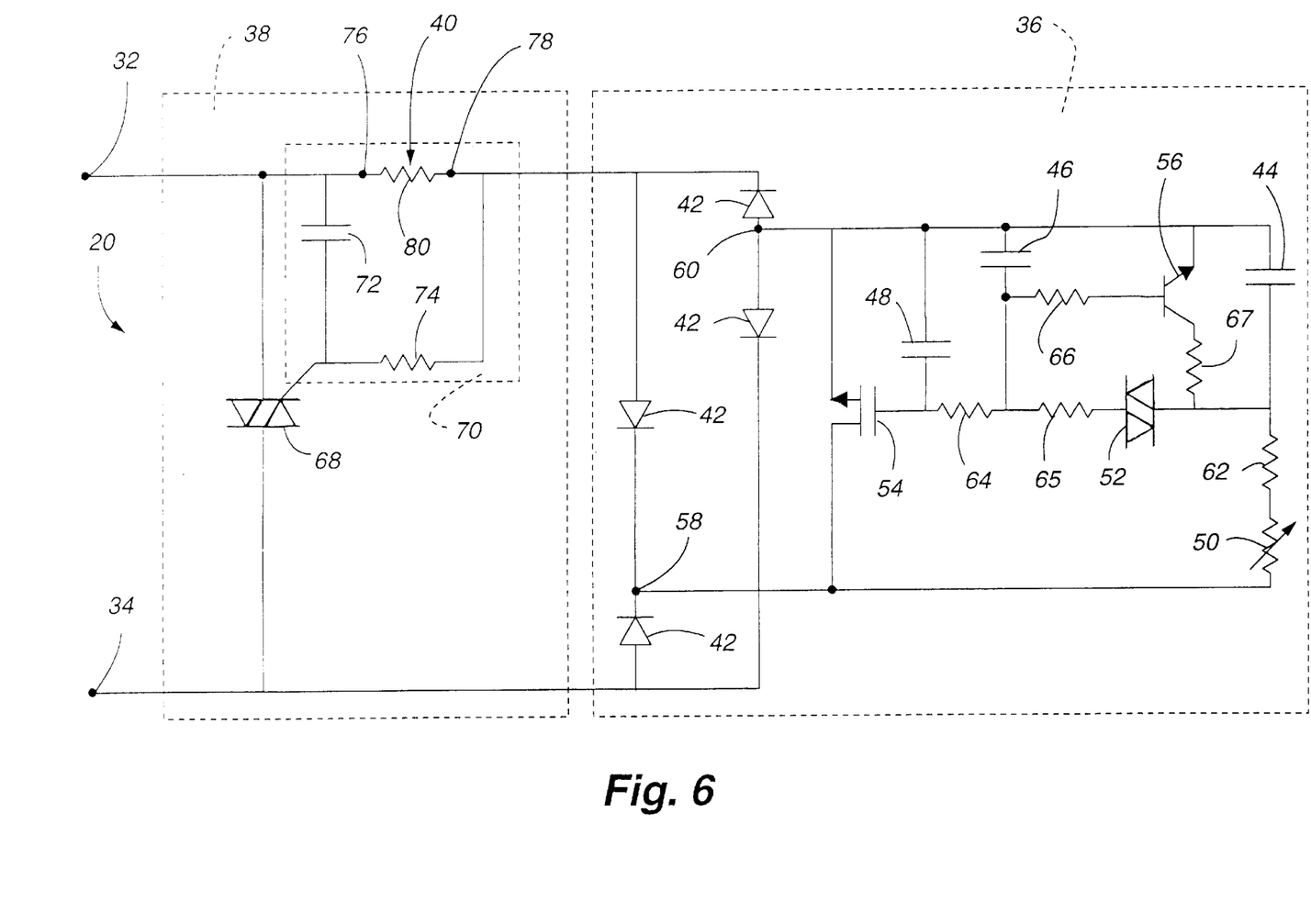
FIG. 6 is a schematic circuit diagram of a preferred embodiment of the dimmer circuit shown in FIG. 1.

An actual embodiment of the dimmer circuit 20 is shown in FIG. 6. The dimmer circuit 20 is connected in series with the load 24 (FIG. 1) at terminals 32 and 34. The dimmer circuit 20 comprises two sub-circuits: a controlled transition circuit 36 and a low forward voltage conduction circuit 38. The two circuits 36 and 38 work in conjunction with each other to reduce interference signal generation and to reduce power consumption. The smooth switching transition time period (from $T_1$ to $T_3$ as shown in FIG. 4) is created by the transition circuit 36 by slowly biasing a power transistor 54 into a current conductive state and therefore eliminating high values of di/dt. The low forward voltage conduction circuit 38 then triggers a thyristor into conduction and causes the second voltage drop at $T_4$ (FIG. 4) to further reduce power consumption for the remainder of the half cycle 37 (FIG. 2). The transition circuit 36 is electrically connected to terminal 32 via a trigger signal developing device 40 and is directly connected to terminal 34. The conduction circuit 38 directly connects to the terminals 32 and 34 and to the transition circuit 36.

The transition circuit 36 operates during each half-cycle of applied source power. The transition circuit 36 is a DC circuit and a conventional diode bridge 42 rectifies the AC power applied at terminals 32 and 34 so that DC current is available at nodes 58 and 60 of the diode bridge 42. At the beginning of each half cycle, a capacitor 44 begins charging from the current flowing through a resistor 62 and a variable resistor 50. The resistors 50 and 62 control the charging rate of the capacitor 44, and the variable resistor 50 adjusts the charging rate of the capacitor 44. The charge level of the capacitor 44 establishes the occurrence of the beginning of the switching transition period, time $T_1$ shown in FIGS. 2, 3 and 4.

When the charge on the capacitor 44 reaches a predetermined voltage, for example, approximately 30–35 volts, a diac 52 is triggered. The diac 52 is a bidirectional, current-conducting switch that only conducts current when the voltage across the diac 52 reaches a predetermined trigger level. The voltage on the capacitor 44 provides the trigger voltage for the diac 52. Once triggered, the diac 52 conducts current which prompts a rapid charging of the capacitor 46. The resulting voltage across the capacitor 46 then allows the capacitor 48 and resistor 64 to deliver a slowly increasing gate voltage bias signal to the switching transistor 54. The slowly rising gate signal causes the switching transistor 54 to transition into full conduction more slowly over a longer period of time ($T_1$ to $T_3$ shown in FIG. 4). The values of the capacitors 46 and 48 and the resistors 64 and 65 are chosen to define the rate of increase in voltage applied to the gate of the switching transistor 54, and thus the values of the capacitor 48 and the resistor 64 also help define the conduction characteristics of the transition circuit 36. The switching transistor 54 reaches full forward conduction at approximately time $T_3$ as shown in FIG. 4.

At time $T_4$ shown in FIG. 4, the low forward voltage conduction circuit 38 switches into conduction which drops the voltage 28 across the dimmer circuit 20 to a lower level than is possible by the fully conductive power transistor 54 and the diodes 42 of the transition circuit 36, typically from approximately 4–6 volts (shown at 33 in FIG. 4) to approximately 1.2–1.6 volts (shown at 35 in FIG. 4). Generally, once the conduction circuit 38 begins conducting current, the conduction circuit 38 essentially diverts current away from the transition circuit 36. This current diversion allows the transition circuit 36 to be reset as described below and, more importantly, lowers the overall voltage across terminals 32 and 34 and thus reduces power consumption of the dimmer circuit 20 for the remainder 37 of the applied half cycle.

The conduction circuit 38 is generally a thyristor-based switching circuit and comprises the thyristor 68 and a delay circuit 70 as shown in FIG. 6. The delay circuit 70, as shown in FIG. 6, comprises the trigger signal developing device 40, a capacitor 72, and a resistor 74. The delay circuit 70 prevents the thyristor 68 from switching into conduction until after the expiration of a predetermined amount of time during which the transition circuit 36 has become fully conductive. This time delay usually lasts longer than the time it takes for the transition circuit 36 to become fully conductive at time $T_3$ (FIG. 4). Otherwise, the thyristor 68 would switch into conduction when the forward voltage across the dimmer circuit 20 is higher than the lowest forward conduction voltage of the transition circuit 36, thus generating a slightly higher di/dt and higher interference signals than would otherwise occur.

The trigger signal developing device 40 generates a voltage as a result of the current flowing through the dimmer circuit 20 between the terminals 76 and 78. The voltage developed by the device 40 occurs at a time after the transition circuit 36 begins to conduct current and is employed to develop a signal sufficient to trigger the thyristor 68 into conduction after the transition circuit reaches the fully conductive state. The capacitor 72 slowly charges in response to the voltage developed across the device 40, and its charging rate is defined by the values of the capacitor 72 and the resistor 74 and the magnitude of the voltage developed by the device 40. The capacitor 72 eventually obtains a predetermined charge sufficient to trigger the thyristor 68 into conduction. Selecting the proper value for the capacitor 72 ensures that the thyristor 68 is not triggered until the transition circuit 36 has reached a fully or otherwise sufficiently conducting state.

Once the thyristor 68 is in full conduction current is diverted from the transition circuit 36 causing the voltage across the terminals 32 and 34 to drop into the range of approximately 1.2 to 1.6 volts. The switching transition characteristics of the thyristor 68 are similar to those shown in FIG. 4. The thyristor creates a more rapid and instantaneous change in current within a relatively short amount of time ($T_1$ to $T_2$ as shown in FIG. 4) compared to the longer transition period shown in FIG. 3. However, because the voltage is only 4–6 volts, for example, across the terminals 32 and 34 when the thyristor switches, a small amount of di/dt is created. The di is limited by the small voltage differential between the starting 4–6 volts and the ending 1.4–1.6 volts, for example. The lower voltage across the terminals 32 and 34 is due to the current conduction through essentially one circuit element, the thyristor 68, which characteristically exhibits a low forward voltage while fully conducting current. The resulting low forward voltage reduces the overall amount of power consumed by the dimmer circuit 20 during the remainder 37 (FIG. 2) of the half cycle as compared to the amount of power that would have been consumed had the transition circuit 36 remained as the primary current conduction path between the terminals 32 and 34.

In the particular embodiment of the delay circuit 70 shown in FIG. 6, the trigger signal developing device 40 is a resistor 80. A limitation of using a resistor is that the voltage developed across it depends on the current conducted by the dimmer circuit 20 which, in turn, depends on the load (24, FIG. 1) connected to the dimmer circuit. To make the delay circuit less sensitive and more independent of the variations in load current, alternative trigger signal developing devices 40 such as those shown in FIGS. 7–9, may be employed in the circuit.

Figure 7:
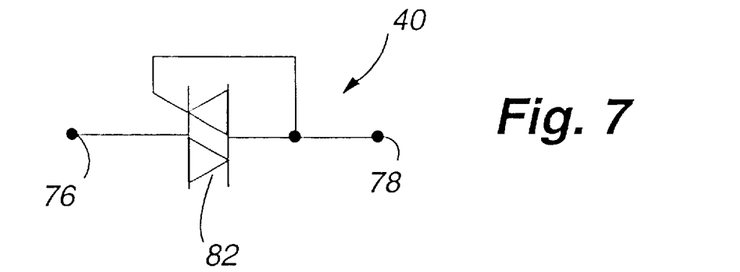
FIGS. 7, 8 and 9 are circuit diagrams of alternatives for certain circuit elements of the dimmer circuit shown in FIG. 6.

FIG. 7 illustrates a thyristor 82 as an alternative embodiment of the trigger signal developing device 40 (FIG. 6). The gate of the thyristor 82 is connected to the node 78. Once the transition circuit 36 begins to conduct a substantial amount of current, the thyristor 82 is triggered into conduction. When in conduction, the thyristor 82 remains on and has a consistent voltage across it until the voltage across it is reversed, i.e., when the AC voltage passes a zero crossing. The inherent impedance, operating voltage specification and other characteristics of the thyristor 82 generate a voltage across it which is sufficient to trigger the thyristor 68 into conduction. On the other hand, the thyristor 82 allows sufficient current to be conducted through the diode bridge 42 of the transition circuit 36 so as to charge the capacitor 44, without triggering the thyristor 68.

Figure 8:
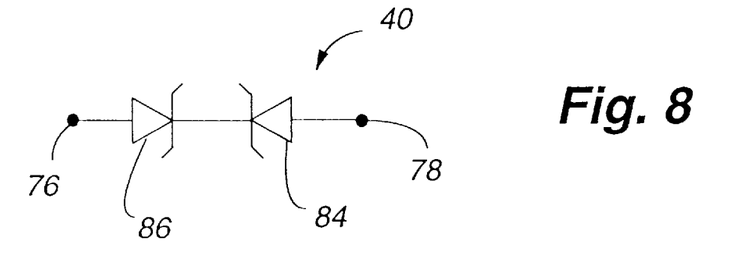

A pair of series-connected, oppositely-poled zener diodes 84 and 86 are shown in FIG. 8 as another alternative to the trigger signal developing device 40. The opposing zener diodes 84 and 86 also produce the required voltage across the nodes 76 and 78 since one of the zener diodes 84 or 86 is forward biased while the other zener diode is biased into its constant voltage breakdown region. The voltage across the zener diodes 84 and 86 is also independent of both the current magnitude and direction during each AC half-cycle.

Figure 9:
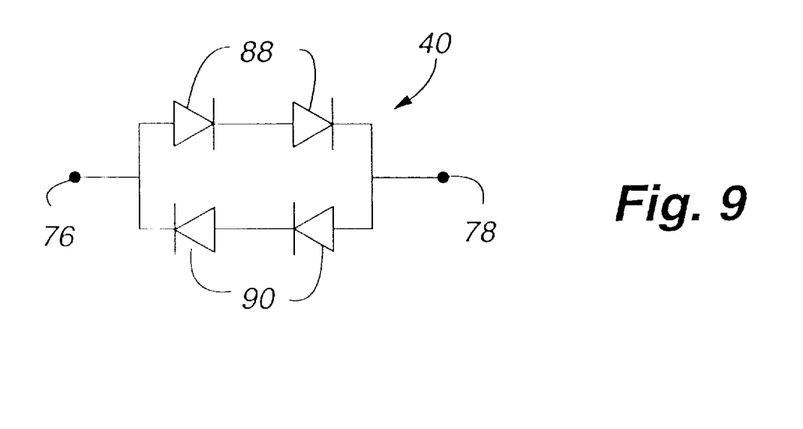

FIG. 9 shows a pair of anti-parallel diode combinations 88 and 90 which can also be used as the trigger signal developing device 40. The anti-parallel diodes combinations 88 and 90 also create the necessary voltage across nodes 76 and 78 independent of the current flow direction. The number of diodes placed in series establishes the voltage drop across the nodes 76 and 78. Placing the diodes in the anti-parallel manner allows for AC operation since exactly half of the diodes will always be forward biased, conducting current and thus developing a voltage.

After the conduction circuit 38 becomes conductive, the transition circuit 36 is reset. Resetting occurs by discharging the capacitor 44 through a resistor 67 every half cycle by a reset transistor 56, as shown in FIG. 6. After the diac 52 fires, the voltage across the capacitor 46 starts to charge, and once it reaches a predetermined level, the reset transistor 56 begins to conduct current which effectively places the resistor 67 in shunt with the capacitor 44 and thus discharges the capacitor 44. A resistor 66 controls the current applied to the base of the reset transistor 56 and therefore helps define the rate that the capacitor 44 is discharged during each half cycle. Discharging is necessary since the dimmer circuit 20 utilizes the charging time of capacitor 44 during each half cycle to basically control the amount of time it takes for the transition circuit 36 to begin the transition from the non-conductive state to conducting current in the conductive state. Therefore the charging time of capacitor 44 determines the amount of power ultimately delivered to the load 24 during each half cycle. Discharging the capacitor after the transition is started assures that the amount of power delivered in each half cycle is consistently reproducible.

When the AC current passes a zero crossing, the conduction circuit 38 is similarly reset. The thyristor 68 only conducts current while a voltage is applied across its terminals. This voltage is not present at zero crossing points. When the applied voltage from the source 22 (FIG. 1) transitions to the other relative polarity at the end of each half cycle, the charge on the capacitor 72 reverses and the thyristor is again triggered at the appropriate time after the transition circuit 36 has reached its fully conductive state.

Figure 10:
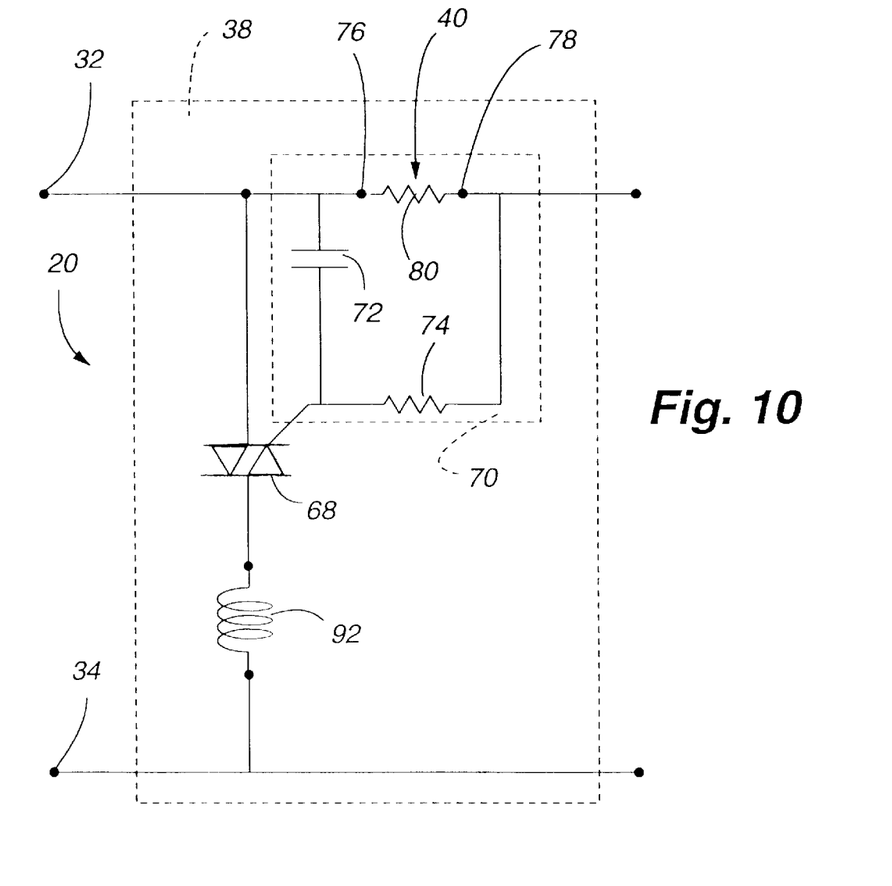
FIG. 10 is a schematic circuit diagram of an alternative portion of the dimmer circuit shown in FIG. 6.

An alternative 38' to the conduction circuit 38 shown in FIG. 6 is shown in FIG. 10. The alternative conduction circuit 38' includes an auxiliary attenuation element 92 connected in series with the thyristor 68 as shown in FIG. 10. In this particular embodiment, the auxiliary attenuation element is an inductor. The auxiliary attenuation inductor 92 may be used in situations where the dimmer circuit 20 is connected to loads that draw large amounts of current. When these higher loads are utilized, the voltage change at time $T_4$ (FIG. 4) and the associated current change per change in time (di/dt) may be large enough to create unacceptable interference signals when the thyristor 68 switches. Therefore, the auxiliary attenuation inductor 92 may be used to slow the current change rate and thus decrease the di/dt associated with the circuit at time $T_4$. Lowering the di/dt value reduces the magnitude of any conducted interference signals.

Figure 11:
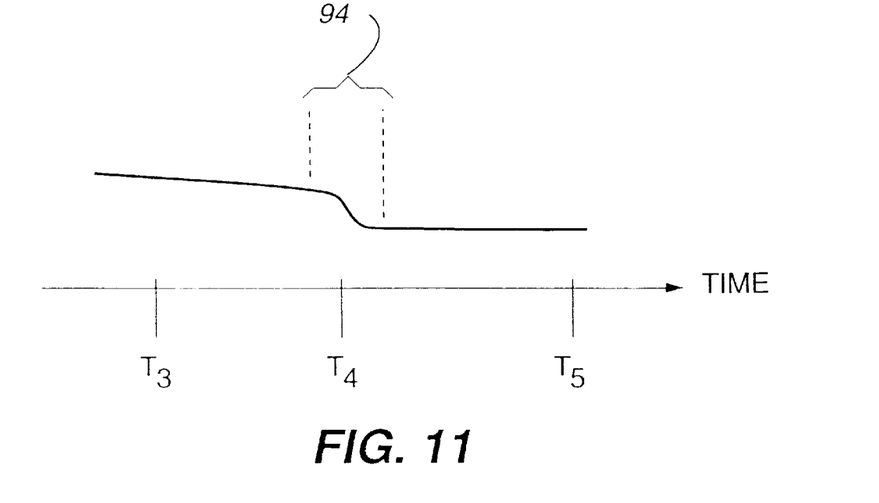
FIG. 11 is an enlarged portion of the waveform diagram shown in FIG. 4 showing the resulting voltage across the dimmer circuit shown in FIG. 1 when the alternative circuit portion shown in FIG. 10 switches into a conductive state.

The voltage characteristics of the dimmer circuit 20 which utilizes the auxiliary attenuation inductor 92 are shown in FIG. 11. As shown at 94, an appreciable amount of time is required to switch the conduction circuit 38' (FIG. 10) into conduction due to the current limiting effects of the inductor 92. By comparison, the conduction circuit 38 (FIG. 6) without the inductor 92 switches into conduction almost immediately as shown at time $T_4$ in FIG. 4. Slowing this transition time reduces the di/dt values during the transition and therefore reduces the magnitudes of the conducted interference signals.

Adding the auxiliary attenuation inductor 92 in this manner does not necessarily add prohibitive size or cost to the manufacturing process. The increase in size does not become a limiting factor because the value of the inductor 92 can be exceedingly small, for example 40 $\mu$H to 100 $\mu$H. The inductor 92 must only smooth the transition over a few volts (from 33 to 35 as shown in FIG. 11), since the bulk of the current change has already occurred (time $T_1$ to time $T_3$ as shown in FIG. 4) as a result of switching effect from the transition circuit 36 (FIG. 6).

The dimmer circuit 20 has the advantages of a smooth switching transistor-based circuit and the advantages of a low power consuming thyristor-based circuit. The smooth switching characteristics of the transition circuit 36 prevent the unwanted generation of large interference signals by reducing the di/dt. The low power consumption of the conduction circuit 38 effectively reduces the power consumed by the dimmer circuit 20. The reduced power consumption significantly reduces heat generation and reduces the need for additional heat dissipating elements, i.e., heat sinks. The absence of heat sinks coupled with the use of relatively small electrical elements reduces the overall size of the dimmer circuit 20. The ultimate size of a preferred embodiment of the dimmer circuit 20 is very small, allowing it to be formed as an integrated circuit small enough to be placed in lamp sockets and other small spaces.

The power conducted to the load 24 by the dimmer circuit 20 may be controlled by manually adjusting the resistor 50 as previously described in conjunction with FIG. 6, or the dimmer circuit 20 may be automatically controlled by a microcontroller device of the nature described in U.S. Pat. No. Re. 35,220. In the circumstance of an automatic control by a microcontroller device, the switching capability of such an automatic device is employed to modify the charging rate of the capacitor 44 in a similar manner to that in which the resistance value of the variable resistor 50 modifies the charging rate of the capacitor 44. In this manner, automatic control over the dimmer circuit 20 is achieved, by a microcontroller device and associated circuitry which are capable of integration into a small integrated circuit along with the dimmer circuit 20.

A presently preferred embodiment of the present invention and many of its improvements have been described with a degree of particularity. This description is of a preferred example for implementing the invention, but the scope of the invention should not necessarily be limited by this description. The scope of the present invention is defined by the following claims.

The invention claimed is:

1. A power control circuit having a relatively smooth turn-on conduction transition characteristic and a relatively low forward voltage drop and power consumption, the power control circuit controlling the amount of power supplied to a load from a source which supplies AC power in alternating half-cycles of AC voltage and current, the power control circuit comprising:

a pair of terminals adapted to be connected in series with the load and the power source and between which current flows to control the amount of power supplied to the load from the source;

a controlled transition circuit electrically connected to conduct current between the terminals when in a fully conductive state and not to conduct current between the terminals when in a non-conductive state, the controlled transition circuit transitioning from the non-conductive state to the fully conductive state over a first predetermined amount of time, the controlled transition circuit creating a first predetermined voltage across the terminals when in the fully conductive state; and a low forward voltage conduction circuit electrically connected to conduct current between the terminals when in a conductive state and to divert current to the controlled transition circuit when in a non-conductive state, the low forward voltage conduction circuit transitioning from the non-conductive state to the conductive state over a second predetermined amount of time, the low forward voltage conduction circuit creating a second predetermined voltage across the terminals when in the conductive state, and the second predetermined voltage being substantially less than the first predetermined voltage.

2. A power control circuit as defined in claim 1 wherein the low forward voltage conduction circuit further comprises:

a delay circuit which operatively initiates a transition from the non-conductive state to the conductive state of the low-forward voltage conduction circuit after the expiration of the first predetermined amount of time.

3. A power control circuit as defined in claim 2 wherein:

a delay circuit which operatively limits the low-forward voltage conduction circuit from conducting current between the terminals until after the controlled transition circuit is in the fully conductive state.

4. A power control circuit as defined in claim 1 wherein the controlled transition circuit further comprises a power transistor and a biasing circuit which supplies an increasing bias signal to the transistor over the duration of the first predetermined amount of time.

5. A power control circuit as defined in claim 4 wherein the biasing circuit initiates the delivery of the bias signal to the transistor at a predetermined power delivery time point within each half-cycle of applied AC current.

6. A power control circuit as defined in claim 5 wherein the low forward voltage conduction circuit comprises a thyristor.

7. A power control circuit as defined in claim 6 wherein the low forward voltage conduction circuit further comprises a trigger signal delivery circuit connected to the thyristor to trigger the thyristor into conduction at the expiration of the first predetermined amount of time.

8. A power control circuit as defined in claim 7 wherein the controlled transition circuit further comprises a reset circuit connected to the transistor to terminate conduction of the transistor after expiration of the second predetermined amount of time.

9. A power control circuit as defined in claim 8 wherein the biasing circuit initiates the start of the first predetermined amount of time after the expiration of a third predetermined amount of time after a zero crossing of the applied AC current.

10. A power control circuit as defined in claim 9 wherein the third predetermined amount of time is adjustable within the half-cycle of applied AC current.

11. A power control circuit as defined in claim 4 wherein the biasing circuit initiates the start of the first predetermined amount of time after the expiration of a third predetermined amount of time after a zero crossing of the applied AC current.

12. A power control circuit as defined in claim 1 wherein the controlled transition circuit further comprises a reset circuit connected to terminate conduction of the controlled transition circuit after the initiation of the second predetermined amount of time.

13. A power control circuit as defined in claim 1 wherein the low forward voltage conduction circuit comprises a thyristor.

14. A power control circuit as defined in claim 13 wherein the low forward voltage conduction circuit further comprises a trigger circuit connected to the thyristor to trigger the thyristor into conduction at the expiration of the second predetermined amount of time.

15. A power control circuit as defined in claim 1 wherein the second predetermined amount of time is substantially less than the first predetermined amount of time.

16. A power control circuit as defined in claim 13 wherein the low forward voltage conduction circuit further comprises an attenuating element connected to the thyristor to limit the change of current per change in time conducted by the thyristor.

17. A power control circuit as defined in claim 16 wherein the attenuating element comprises an inductor.

18. A power control circuit having a relatively smooth turn-on conduction transition characteristic for controlling the amount of power supplied to a load, the dimming circuit adapted to be connected in series with the load and a source of AC power which is applied in alternating half-cycles of AC voltage and AC current, the power control circuit comprising:

a controlled transition circuit to conduct current initially through the load, said controlled transition circuit comprising:

a switching transistor having a control terminal;

a bias signal generating circuit connected to the control terminal of the transistor to generate a bias signal which increases in magnitude over a first predetermined amount of time, the magnitude of the bias signal generally establishing the magnitude of conductivity of the switching transistor; and the switching transistor responding to the bias signal applied at the control terminal to transition from a non-conductive state to a fully conductive state over the duration of the first predetermined amount of time; and a low forward voltage conduction circuit connected to the transition circuit, the conduction circuit operatively conducting current through the load after the switching transistor achieves the fully conductive state, the low forward voltage conduction circuit comprising:

a thyristor connected in series with the load and the source and operative to be triggered into a conductive state in response to the application of a trigger signal applied thereto;

a trigger signal developing device responsive to the current conducted to the load by the switching transistor to develop a trigger signal from the current conducted by the switching transistor; and a delay circuit connected between the trigger signal developing device and the thyristor to delay the application of the trigger signal to the thyristor for a predetermined amount of time sufficient to allow the transistor to achieve the fully conductive state.

19. A power control circuit as defined in claim 18 wherein the bias signal generating circuit further includes:

a capacitor which accumulates charge prior to the initiation of the first predetermined amount of time; and a diac connected to the capacitor and the control terminal of the switching transistor, the diac becoming conductive upon the charge on the first capacitor reaching a predetermined level, the diac causing the bias signal to be conducted to the control terminal of the switching transistor when the diac becomes conductive.

20. A power control circuit as defined in claim 18 wherein the trigger circuit developing device further comprises:

a second thyristor in addition to the first thyristor aforesaid, the second thyristor connected to conduct current flowing from the source through the controlled transition circuit.

21. A power control circuit as defined in claim 18 wherein the trigger circuit developing device further comprises:

a pair of Zener diodes connected in series in an oppositely poled direction to conduct current flowing from the source through the controlled transition circuit.

22. A power control circuit as defined in claim 18 wherein the trigger circuit developing device further comprises:

a pair of diodes connected in an anti-parallel relationship to conduct current flowing from the source through the controlled transition circuit.

23. A power control circuit as defined in claim 18 wherein the controlled transition circuit further comprises:

a reset circuit connected to the bias signal generating circuit and operative to reduce the magnitude of the bias signal to an ineffective level after the conduction circuit conducts current through the load.

24. A power control circuit as defined in claim 23 wherein the reset circuit further comprises:

a second transistor in addition to the switching transistor first aforesaid, the second transistor connected in shunt with the capacitor to discharge the capacitor.

25. A power control circuit as defined in claim 18 wherein the low forward voltage conduction circuit further comprises an attenuating element connected to the thyristor to limit the change of current per change in time conducted by the thyristor.

26. A power control circuit as defined in claim 25 wherein the attenuating element comprises an inductor.

27. A method of controlling the amount of power supplied to a load connected to an AC power source while reducing generation of interference signals and while consuming small amounts of power, said method comprising the following steps:

attaching a switching transistor substantially in series with the load and the AC power source;

biasing the switching transistor from a non-conductive state to a first conductive state over a predetermined amount of time, said predetermined amount of time being substantially long enough to reduce its change in current per change in time to a sufficiently low value to limit substantially the interference signal generation occurring as a result of the transition from the non-conductive state to the first conductive state;

establishing a predetermined voltage across the switching transistor in the first conductive state;

attaching a thyristor in series with the load and the AC power source and substantially in parallel with the switching transistor;

triggering the thyristor from a non-conductive state into a second conductive state after expiration of the predetermined amount of time; and establishing a predetermined voltage across the thyristor in the second conductive state which is less than the voltage across the switching transistor in the first conductive state.

28. A method as defined in claim 27 further comprising the following step:

delaying the triggering of the thyristor for a predetermined amount of time after the switching transistor commences conducting current.

29. A method as defined in claim 27 further comprising the step of:

limiting a change of current flow through the thyristor per change in time.

30. A method as defined in claim 29 further comprising the step of:

passing current from the thyristor in the conductive state through an inductor to limit the change of current flow per change in time.

* * * * *